(12) United States Patent
Tominaga

(10) Patent No.: US 7,130,015 B2
(45) Date of Patent: Oct. 31, 2006

(54) INERT-GAS PURGE METHOD, EXPOSURE APPARATUS, DEVICE FABRICATION METHOD AND DEVICES

(75) Inventor: Yasuteru Tominaga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 48 days.

(21) Appl. No.: 11/001,115

(22) Filed: Dec. 2, 2004

(65) Prior Publication Data

US 2005/0122493 A1   Jun. 9, 2005

(30) Foreign Application Priority Data

Dec. 3, 2003   (JP) .............................. 2003-403918

(51) Int. Cl.
*G03B 27/32* (2006.01)
*B03B 27/52* (2006.01)
(52) U.S. Cl. .......................................... 355/30; 355/77
(58) Field of Classification Search .................. 355/30, 355/53, 67, 77
See application file for complete search history.

(56) References Cited

U.S. PATENT DOCUMENTS 6,914,667 B1 * 7/2005 Yamamoto ................... 355/53

| 2002/0000519 A1 * | 1/2002 | Tsukamoto | 250/492.1 |
| 2002/0036760 A1 * | 3/2002 | Udagawa et al. | 355/53 |
| 2005/0110968 A1 * | 5/2005 | Aichi et al. | 355/30 |

FOREIGN PATENT DOCUMENTS

JP          6-216000          8/1994

* cited by examiner

*Primary Examiner*—Rodney Fuller
(74) *Attorney, Agent, or Firm*—Fitzpatrick, Cella, Harper & Scinto

(57) ABSTRACT

An exposure apparatus for exposing a substrate to light from a light source via a reticle. The apparatus includes an optical system configured to introduce the light via the reticle to the substrate, a chamber configured to house at least a part of the optical system, a supply system configured to supply inert gas into the chamber at a variable supply flow rate, an exhaust system configured to exhaust gas from the chamber at a variable exhaust flow rate, and a controller configured to control the supply system so as to reduce the supply flow rate, and configured to control the exhaust system so as to reduce the exhaust flow rate prior to the reduction of the supply flow rate.

13 Claims, 12 Drawing Sheets

US 7,130,015 B2

INERT-GAS PURGE METHOD, EXPOSURE APPARATUS, DEVICE FABRICATION METHOD AND DEVICES

BACKGROUND OF THE INVENTION

The present invention relates generally to a method of purging materials (interfering substances) from a chamber, and, more particularly, to a method of purging the interfering substances from an atmosphere around an optical system using an inert gas in an exposure apparatus for exposing a substrate, such as a single crystal substrate for a semiconductor device and a glass substrate for a liquid crystal display device ("LCD"). The present invention also relates to an exposure apparatus to which the purge method is applied, and a device manufacturing method that uses the exposure apparatus.

A reduction projection exposure apparatus has been conventionally employed which uses a projection optical system to project a circuit pattern formed on a mask (or a reticle) onto a wafer, etc., to transfer the circuit pattern, in manufacturing such a fine semiconductor device as a semiconductor memory and a logic circuit in photolithography technology. Recently, semiconductor integrated circuits have increasingly improved the degree of integration, and the present trend requires a nano order of fine processing. For this purpose, the exposure apparatus is using a laser with a short wavelength for an exposure light source. In addition, in order to maintain stable exposure performance, the exposure apparatus is designed to maintain high cleanability, and be used in an atmosphere that contains extremely little in impurities, such as a clean room.

However, as the exposure light source laser has a shorter wavelength, the exposure light causes the residual material in the exposure apparatus to photochemically react with oxygen ($O_2$), and reaction products, such as $(NH_2)\ SO_4$, to adhere to and blur optical elements, such as a lens and a mirror, disadvantageously deteriorating the light intensity.

Therefore, the exposure apparatus, which uses a KrF excimer laser and an ArF excimer laser for a light source, adopts a method for purging the atmosphere around the optical elements arranged on the laser's optical path with the inert gas in order to prevent not only a deteriorated light intensity due to the impurities' adhesions to the optical elements, but also reduced transmittance due to the light absorption in oxygen, etc., in the atmosphere on the optical path.

For example, an exposure apparatus 500, which has an internal structure schematically shown in FIG. 11, generally includes a laser light source 100, an illumination optical system 102 for converting into light having a predetermined shape, a laser beam 100a that serves as the illumination light emitted from the laser light source 100, and a projection optical system 103 that images onto the wafer (substrate) 100W, the shaped laser beam 100a that has passed a reticle (or an original form) 100R.

The illumination optical system 102 includes plural optical elements, such as plural types of lens units 104a, 104b and 104c and mirrors 105a and 105b, and serves to irradiate the laser beam 100a onto an illumination area on the reticle 100R. The illumination optical system 102 and the projection optical system 103 are sealed in chambers 102a and 103a, respectively, to which a nitrogen supply unit 106 for supplying nitrogen gas (or inert gas) 106a is connected via nitrogen gas supply lines 109a and 109b and the mass flow controller 110a and 110b.

Gas exhaust lines 111a and 111b are connected to an exhaust port via valves 112a and 112b. In purging, with the nitrogen gas, the inside of the chamber 102a of the illumination optical system and the inside of the chamber 103a of the projection optical system, these gas exhaust lines 111a and 111b exhaust inside impurities and always maintain the insides of the chambers 102a and 103a to be clean. The "impurities", as used herein, means the residual materials in the chamber other than nitrogen gas as the purge gas, and cover oxygen, organic materials, reaction products between oxygen and the organic materials, outgas, water, etc. The outgas is emitted gas, which is gradually emitted from surfaces of respective components, such as an optical element and a barrel, housed in the chamber.

When the facilities of the exposure apparatus 500 stop, the valves 112a and 112b close so as to protect the insides of the chambers 102a and 103a from the ambient atmosphere. The chamber 102a is provided with oxygen concentration detectors 113a, 113b and 113c, and the chamber 103a is provided with an oxygen concentration detector 113d. Prior to exposure, these detectors detect the oxygen concentrations in the chambers 102a and 103a, so as to confirm whether the passage atmosphere of the laser beam 100a is sufficiently replaced with nitrogen gas and whether the exposure performance can be maintained.

The illumination optical system 102 needs exchanges of components when the performance of the optical element deteriorates due to contaminations caused by the photochemical reactions and long-term use. In addition, in order to adjust an output of the laser beam 100a (exposure light) in accordance with the exposure plan, a user may change a dimmer filter (not shown) provided to the illumination optical system 102 to another type. Therefore, the inside of the chamber 102a in the illumination optical system is often released to the air and the impurity concentration becomes frequently high.

As one maintenance called optical cleaning, the exposure apparatus 500 generates ozone by introducing oxygen into a space on the exposure optical path, and uses ozone to remove contaminants adhered on the optical elements. Even after this maintenance, the oxygen concentration sometimes becomes high in each of the chambers 102a and 103a for respective optical systems and misses the exposure condition. In this case, the exposure apparatus should inefficiently wait for the exposure for a certain time period of the nitrogen gas purge (while this standby time is called downtime) until the oxygen concentration reduces down to an exposable state.

For an effectively shortened downtime, one proposal has been already made (see, for example, Japanese Patent Application, Publication No. 6-216000). This proposal increases and decreases the flow rate of the purge gas based on the oxygen concentration in the exposure apparatus, and promptly replaces the inside of the exposure apparatus with inert gas without consuming a large amount of purge gas. FIG. 12 shows a flowchart for explaining the nitrogen purge process disclosed in Japanese Patent Application, Publication No. 6-216000.

However, the proposal in Japanese Patent Application, Publication No. 6-216000, causes a standby time period after the flow rate of the purge gas reduces. This is because the reduced flow rate of the purge gas deteriorates the exhaust performance in the chamber for housing the exposure apparatus's optical system, and causes backflow of the air outside the chamber and rapid increases of oxygen concentration and organic concentration of the material. As a result, the exposure conditions are not met temporarily.

In particular, an $F_2$ laser for a next-generation exposure apparatus has a light absorption factor to oxygen one hundred times as large as that of the ArF laser. In order to obtain the light intensity using the $F_2$ laser equivalent to the ArF laser, both the oxygen concentration and water concentration should be maintained to be below 10 ppm. In addition, since it is anticipated that the $F_2$ laser is more sensitive to blurring due to organic materials than the ArF laser, it is forecasted that a slightly increased amount of oxygen and organic materials affect the exposure performance, and the downtime becomes long.

Accordingly, there is a demand for an inert-gas purge method that inexpensively reduces the impurity concentration in the atmosphere around the optical system in an exposure apparatus, and shortens the downtime. In addition, there are other demands for an exposure apparatus, a device fabrication method using the exposure apparatus, and manufactured devices, in which the exposure apparatus utilizes the above inert-gas purge method to improve the exposure performance and efficiency, and maintains high precision and high throughput.

BRIEF SUMMARY OF THE INVENTION

An exposure apparatus according to one aspect of the present invention includes an optical system to direct light to project a pattern of an original onto a substrate, a chamber to house at least a part of the optical system, a supply system to supply inert gas into the chamber, a supply control system to control a supply speed of the inert gas from the supply system, an exhaust system to exhaust gas from the chamber, and an exhaust control system to increase resistance of the exhaust system in synchronization with a reduction of the supply speed by the supply control system.

A device fabrication method according to another aspect of the present invention includes the steps of projecting a pattern onto a substrate using the above exposure apparatus, and developing the substrate onto which the pattern is projected.

A purge method according to another aspect of the present invention adapted to an exposure apparatus for projecting a pattern of an original onto a substrate by directing light using an optical system, at least a part of the optical system being housed in a chamber, the purge method purging a material in the chamber with inert gas, the method includes a supply step of supplying the inert gas into the chamber using a supply system, an exhaust step of exhausting gas from the chamber using an exhaust system, a supply control step of controlling a supply speed of the inert gas from the supply system, and an exhaust control step of increasing resistance of the exhaust system in synchronization with a reduction of the supply speed in the supply control step.

DETAILED DESCRIPTION OF THE PREFERRED EMBODIMENTS

First Embodiment

Figure 1:
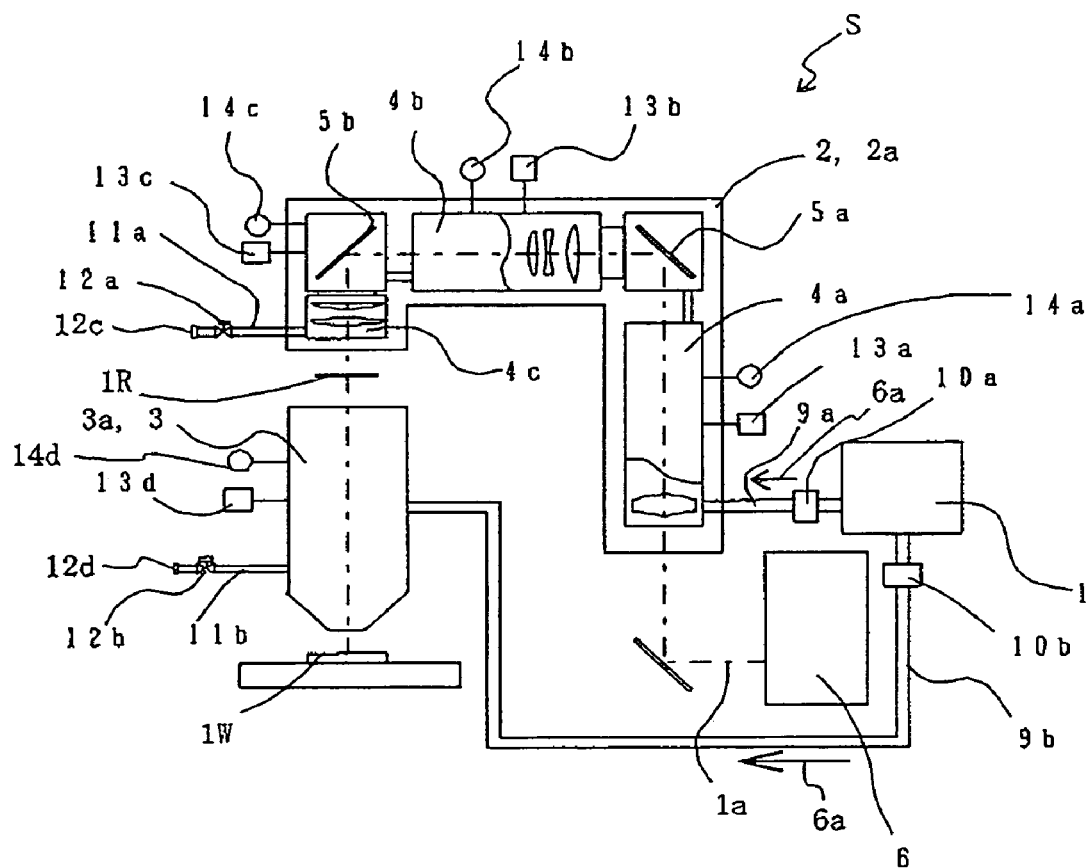
FIG. 1 is a block diagram showing a schematic internal structure of an exposure apparatus according to a first embodiment of the present invention.

With reference to the accompanying drawings, a description will now be given of an exposure apparatus and an inert-gas purge method according to a first embodiment of the present invention. FIG. 1 is a block diagram showing a schematic internal structure of an exposure apparatus S according to the first embodiment of the present invention. The exposure apparatus S generally includes a laser light source 1, an illumination optical system 2 for converting a laser beam 1a as the illumination light emitted from the laser light source 1 into light having a predetermined shape, and a projection optical system 3 for imaging the shaped laser beam 1a that has passed a reticle (or an original form) 1R, onto the wafer (or a substrate) 1W. This configuration introduces the laser beam 1a to the wafer 1W via the optical systems 2 and 3 and the reticle 1R, and exposes a pattern on the reticle 1R onto the wafer 1W.

The illumination optical system 2 includes plural optical elements, such as plural types of lens units 4a, 4b and 4c and mirrors 5a and 5b, and serves to irradiate the laser beam 1a onto an illumination area on the reticle 1R. The illumination optical system 2 and the projection optical system are sealed in chambers 2a and 3a, respectively, to which a nitrogen supply unit 6 for supplying nitrogen gas (or inert gas) 6a is connected via nitrogen gas supply lines 9a and 9b and the mass flow controllers 10a and 10b.

The mass flow controllers (or gas supply channel controllers) 10a and 10b can variably control the supply flow rates of nitrogen gas 6a, and supply a constant flow rate of nitrogen gas 6a when set to predetermined flow rates, without being affected by pressure changes in the chambers 2a and 3a. When the impurity concentration in the chamber 2a and 3a is equal to or smaller than a certain concentration, these mass flow controllers 10a and 10b are configured to reduce the nitrogen supplies from the nitrogen supply unit 6.

Gas exhaust lines 11a and 11b are connected to exhaust port via valves 12a and 12b. In purging, with the nitrogen gas 6a, the inside of the chamber 2a of the illumination optical system and the inside of the chamber 3a of the projection optical system, these gas exhaust lines 11a and 11b exhaust the inner impurities and always maintain the insides of the chambers 2a and 3a clean.

When the facilities of the exposure apparatus 1 stop, the valves 12a and 12b close so as to protect the insides of the chambers 2a and 3a from the ambient atmosphere. The chamber 2a is provided with oxygen concentration detectors 13a, 13b and 13c, and the chamber 3a is provided with an oxygen concentration detector 13d. Prior to exposure, these detectors detect the oxygen concentrations in the chambers 2a and 3a, so as to confirm whether the passage atmosphere of the laser beam 1a is sufficiently replaced with nitrogen gas and whether the exposure performance can be maintained.

An exhaust mass flow controller includes valves 12a and 12b and a valve controller (not shown). This exhaust mass flow controller serves to control the pressures in the chambers 2a and 3a in accordance with the supply flow rate of the nitrogen gas 6a from the nitrogen supply unit 6. More specifically, when the supply flow rate of the nitrogen gas 6a reduces from the nitrogen supply unit 6, the valve controller adjusts the valves 12a and 12b at the exhaust ports 12c and 12d and reduces the exhaust flow rate from a first flow rate to a second flow rate.

Pressure gauges (or pressure detectors) 14a, 14b and 14c are provided to the chamber 2a, and the pressure gauge 14d is provided to the chamber 3a. These pressure gauges 14a to 14d serve to detect the pressures in the chambers 2a and 3a. The valve controller adjusts, based on pressure detection results by the pressure gauges 14a to 14d, the valves 12a and 12b so that the pressures in the chambers 2a and 3a do not become negative relative to the ambient pressure (or the external pressure outside the chambers 2a and 3a).

Figure 2:
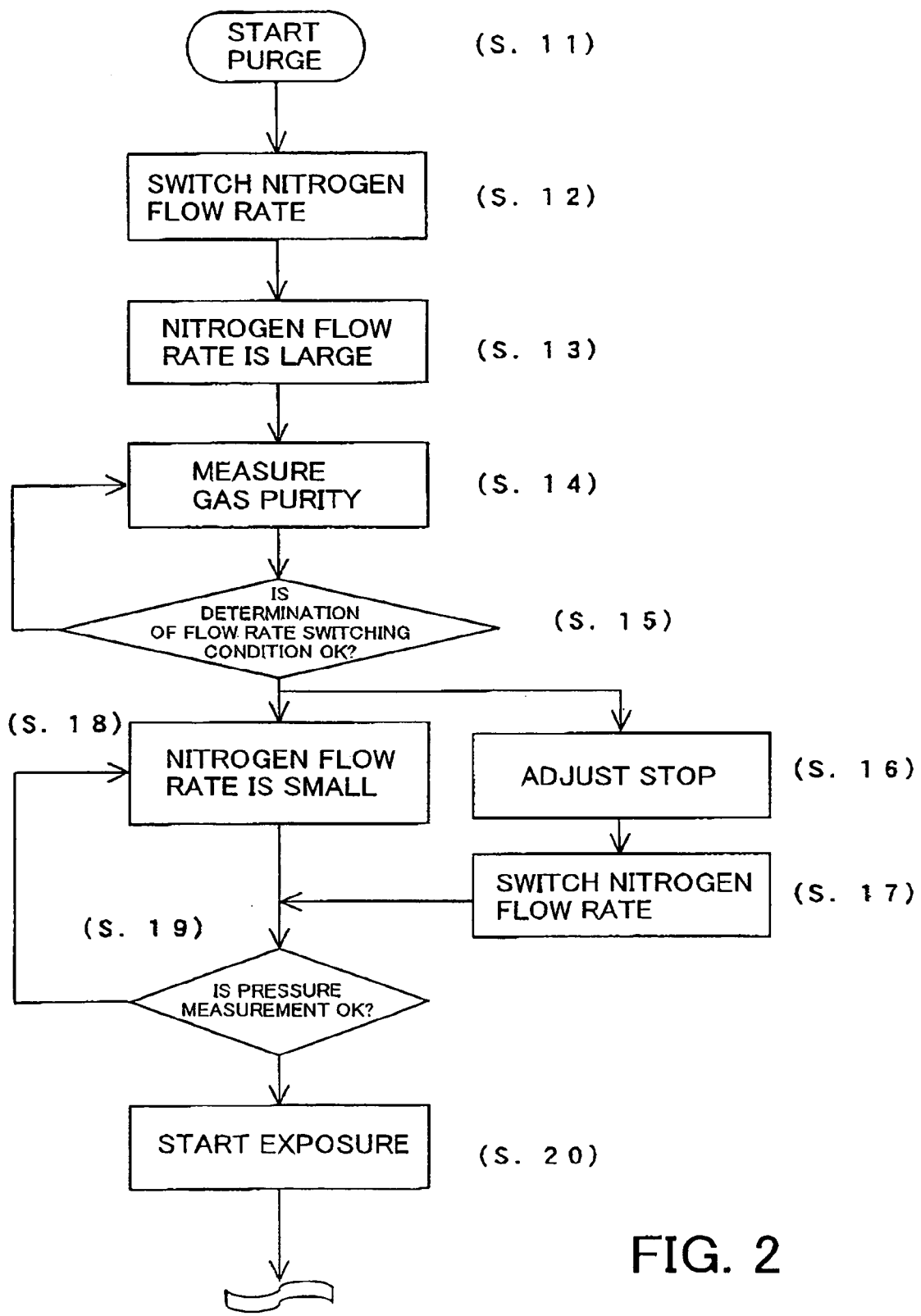
FIG. 2 is a flowchart showing an inert-gas purge procedure by the exposure apparatus shown in FIG. 1.

Referring now to a flowchart shown in FIG. 2, a description will be given of the nitrogen gas purge method in this exposure apparatus S.

For example, when the chamber 2a is released to the air for maintenance of one of the lens units 4a to 4c in the illumination optical system 2, the internal atmosphere in the chamber has a deteriorated impurity concentration due to oxygen and organic materials, just after it is released to the air. In addition, since the impurities contained in the air adhere to the lens units 4a to 4c, the surfaces of the elements increasingly outgas.

In this case, the chamber 2a of the illumination optical system 2 and the chamber 3a of the projection optical system are purged with the inert gas. First, the purge starts when the nitrogen supply unit 6 supplies the nitrogen gas 6a to the chambers 2a and 3a (step S. 11). At the same time, controls by the mass flow controllers 10a and 10b switch the flow rate of the nitrogen gas 6a (step S. 12), and supply a large amount of nitrogen gas 6a to the chambers 2a and 3a (inert-gas supply step S. 13).

A supply of a large amount of nitrogen gas 6a enables the atmosphere in the chambers 2a and 3a to be replaced quickly, and the impurities in the atmospheres, such as oxygen, to be exhausted from the exhaust ports 12c and 12d at a first exhaust flow rate (first exhaust step). Simultaneously, removal of the deposits on the lens units 4a to 4c deplete the outgas source promptly. Since a large amount of nitrogen gas 6a is supplied to the chambers 2a and 3a, the internal pressures in the chambers 2a and 3a rise and are higher than the ambient pressure (or the external pressure outside the chambers).

When the purge starts, the oxygen concentration detectors 13a to 13d detect the oxygen concentrations in the chambers 2a and 3a (concentration detection step S. 14). Thereby, it is possible to determine the progress of the replacement with the inert gas in the chambers 2a and 3a and the degree of depletion of the outgas source. When the oxygen concentrations in the chambers 2a and 3a are larger than the preset concentrations, the replacement with the inert gas is not sufficient and a supply of a large amount of nitrogen gas 6a continues. However, the oxygen concentrations in the chambers 2a and 3a are smaller than the preset concentrations (step S. 15), the mass flow controllers 10a and 10b switch the flow rate (step S. 16), and the supply flow rate of the nitrogen gas 6a reduces (a supply flow rate reducing step S. 17). This configuration prevents an excessive supply of the nitrogen gas 6a, saving the use amount, and prevents the residual impurities from being swirled up to the optical path in the chambers 2a and 3a. For example, when the internal pressures in the chambers 2a and 3a rise, it is conceivable that the supply amount of the nitrogen gas 6a naturally reduces. However, the first embodiment uses switching actions by the mass flow controllers 10a and 10b, and intentionally reduces the supply amount. In this case, for example, the supply amount can be reduced stepwise or discontinuously.

At the same time, as or prior to, the reduction of the supply flow rate of the nitrogen gas 6a, the valve controller adjusts the valves 12a and 12b on the exhaust lines 11a and 11b, and turns the first exhaust flow rate to the second exhaust flow rate (second exhaust step S. 18). This embodiment uses the pressure gauges 14a to 14d to detect the internal pressures of the chambers 2a and 3a (step S. 19), determines the second exhaust flow rate and adjusts the valves 12a and 12b so that the pressure in the chamber maintains the predetermined pressure (such as the ambient pressure) or higher (exhaust flow rate determining step). This configuration enables the insides of the chambers 2a and 3a to be always at a positive pressure state, although the supply flow rate of the nitrogen gas 6a reduces, preventing the backflows and entries of the external air into the chambers 2a and 3a via joint parts between the components of the chambers 2a and 3a and via the exhaust ports 12c and 12d. The exposure starts without the downtime, because there is no temporary oxygen concentration due to the backflow of the external air (step S. 20). In the first embodiment, the first and second exhaust steps are implemented by using the exhaust ports of the same exhaust channels, i.e., the exhaust port 12c in the chamber 2a and the exhaust port 12d in the chamber 3a.

The valves 12a and 12b may be adjusted prior to the reduction of the supply flow rate of the nitrogen gas 6a. It is also possible to predetermine the second exhaust flow rate that can maintain the insides of the chambers 2a and 3a in the positive stages, and allow the valve controller to adjust the valves 12a and 12b so that the second exhaust flow rate is automatically set as soon as the nitrogen gas supply flow rate reduces. This configuration can achieve the objects of the present invention without the pressure gauges 14a to 14d. This embodiment provides prompt and sufficient nitrogen gas purge while saving the consumed gas amount.

Experimental Results

Figure 3:
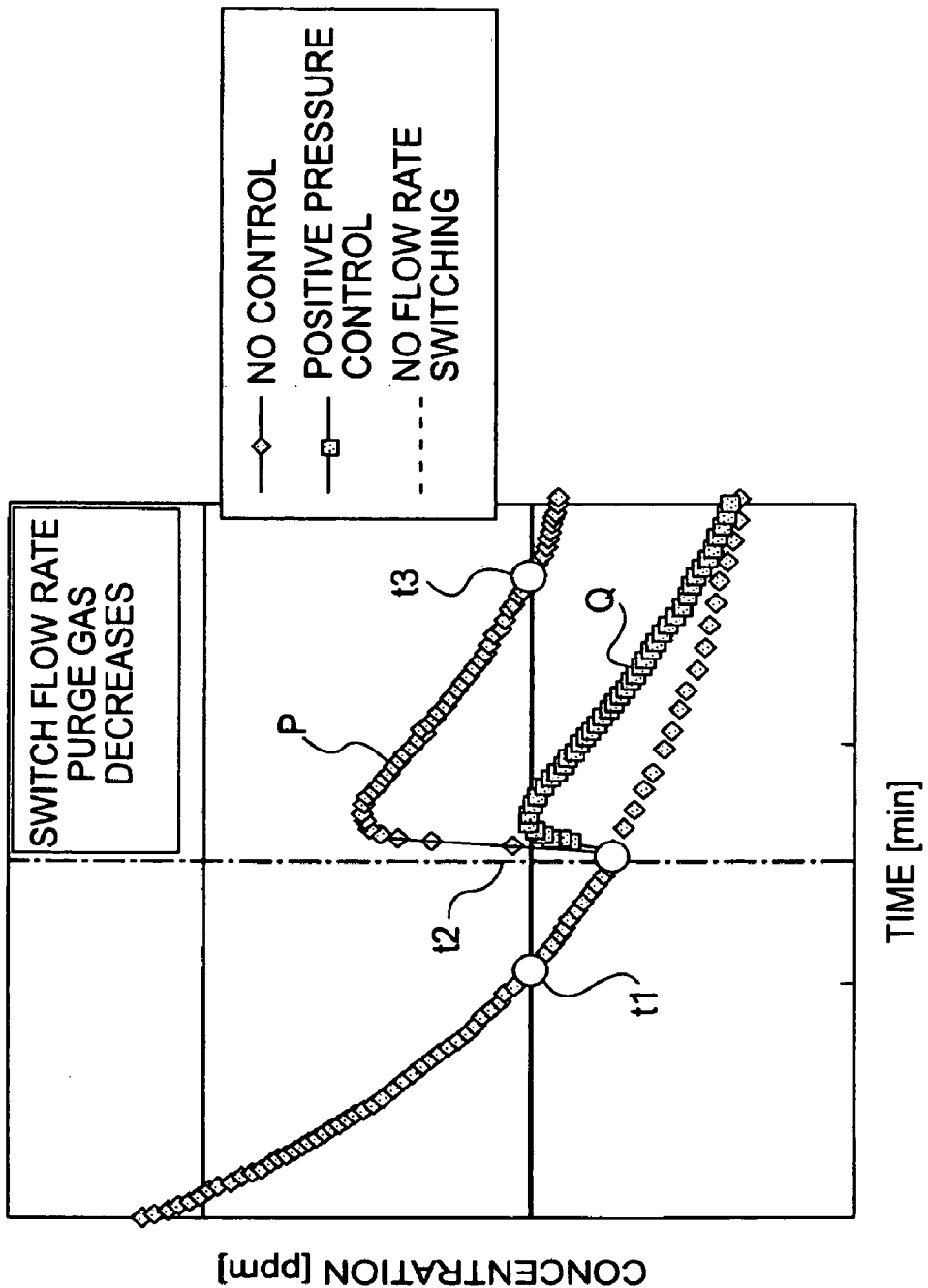
FIG. 3 shows measurement results of oxygen concentrations in the chamber resulting from purging by the inventive inert-gas purge method and purging by the prior art inert-gas purge method.

FIG. 3 shows measurement results of oxygen concentrations in the chamber resulting from purging by the inventive inert-gas purge method and purging by the prior art inter-gas purge method. The conventional method reduces the nitrogen gas supply flow rate, but does not control the chamber's internal pressure in response to the reduction of the exhaust flow rate. In FIG. 3, an abscissa axis denotes the time, and the ordinate axis denotes the oxygen concentration. A line B indicates the oxygen concentration as an exposable condition, and the exposure is available when the oxygen concentration is below the line B.

Curve P indicates the prior art, and the oxygen concentration reduces after the purge starts, and becomes below the line B at time t1, whereby the exposure is available. Thereafter, when the nitrogen gas supply flow rate reduces at time t2, the oxygen concentration rises again and the exposure becomes unavailable at time t3. This is because the outgas from the components cannot be exhausted due to the reduction of the nitrogen gas supply flow rate, and the external air backflows in the chamber from the exhaust ports, and the joints of the chamber due to the lowered internal pressure of the chamber. In addition, the components outgas easily under the lowered chamber's internal pressure. In this case, the exposure becomes unstable until time t3 after the purge starts and the long downtime occurs.

On the other hand, curve Q indicates the inventive purge method. The oxygen concentration decreases after the purge starts, and becomes below the line B at time t1, whereby the exposure is available. Thereafter, when the nitrogen gas supply flow rate reduces at time t2, the oxygen concentration rises again. However, as the reduced exhaust flow rate increases, the chamber's internal pressure reduces and maintains the positive pressure state, the external air hardly backflows in the chamber from the exhaust ports and the joints of the chamber. The increased value of the oxygen concentration is maintained to be about half the value in the curve P. Therefor, the curve Q does not exceed the line B again, and the stable exposure condition is maintained.

Thereby, the inventive inert-gas purge method provides stable exposure at the time t1 after the purge starts with little downtime. Since the internal pressure of the chamber is maintained at the positive pressure state, the components seldom outgas in the chamber.

Figure 4:
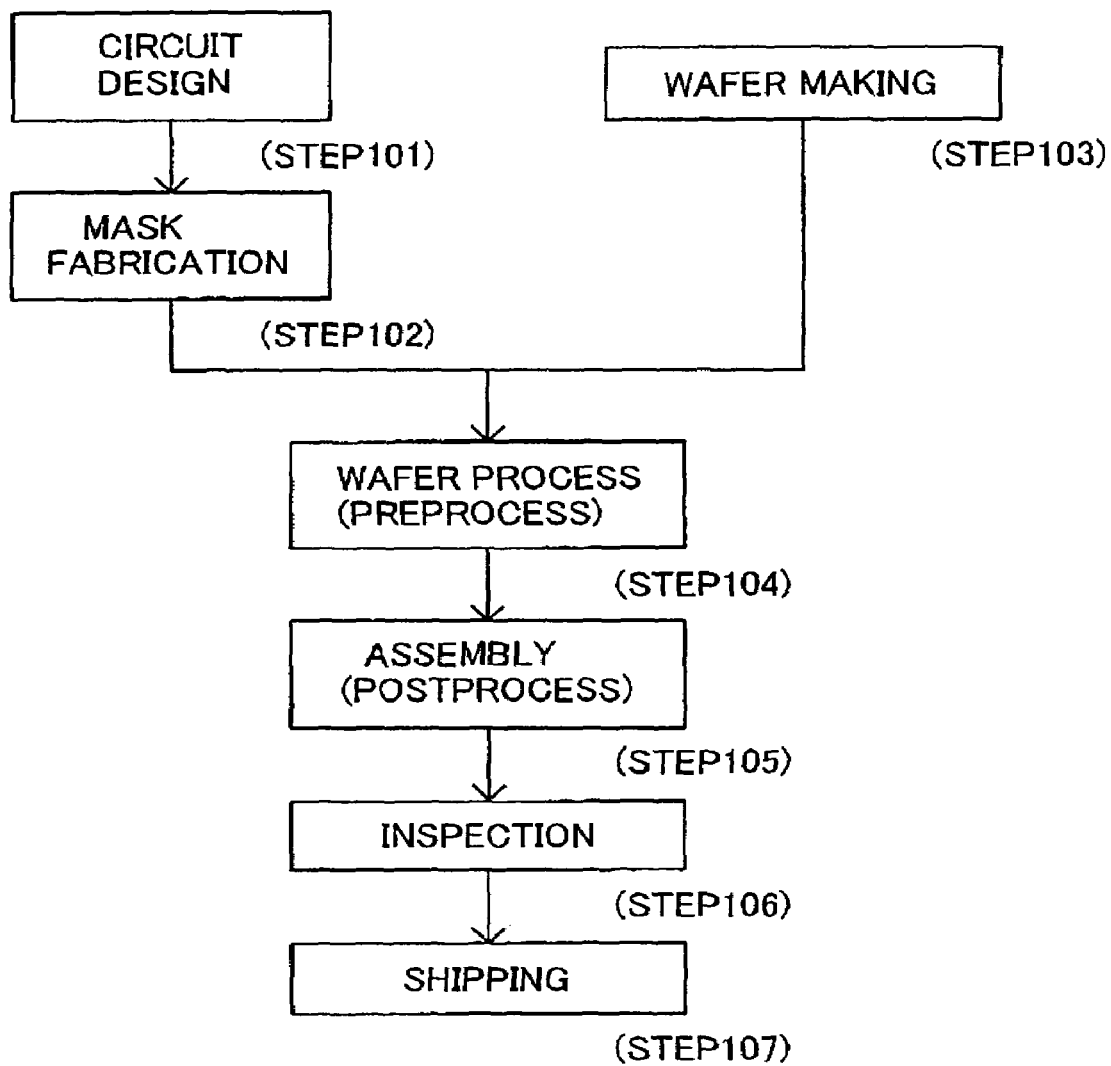
FIG. 4 is a flowchart for explaining a device fabrication method using an exposure apparatus shown in FIG. 1.
Figure 5:
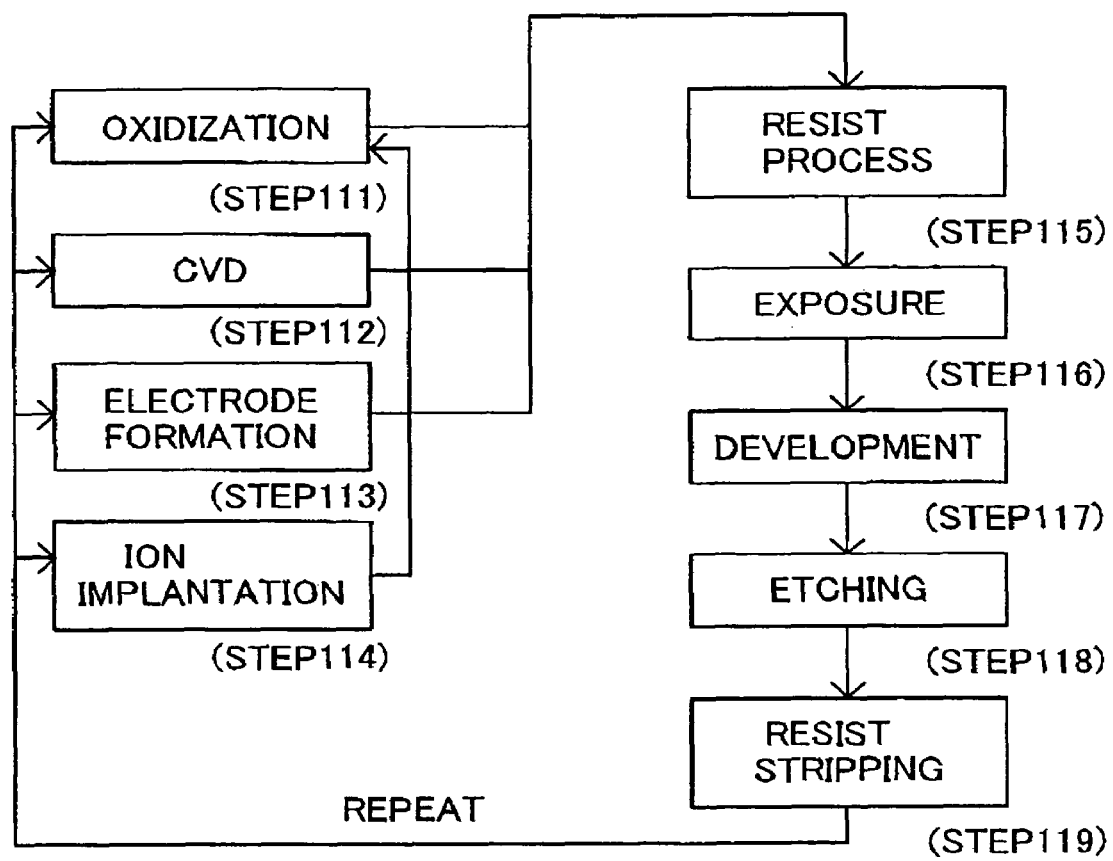
FIG. 5 is a detailed flowchart of step 104 in FIG. 4.

Referring to FIGS. 4 and 5, a description will now be given of an embodiment of a device fabricating method using the exposure apparatus S mentioned above. FIG. 4 is a flowchart for explaining a fabrication of devices (i.e., semiconductor chips, such as ICs and LSIs, LCDs, CCDs, etc.). Here, a description will be given of a fabrication of a semiconductor chip as an example. Step 101 (circuit design) designs a semiconductor device circuit. Step 102 (reticle fabrication) forms a mask having a designed circuit pattern. Step 103 (wafer preparation) manufactures a wafer (which is an object to be exposed) using materials such as silicon. Step 104 (wafer process), which is referred to as a pretreatment, forms actual circuitry on the wafer through photolithography using the mask and wafer. Step 105 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 105, such as a validity test and a durability test. Through these steps, a semiconductor device is finished and shipped (Step 107).

FIG. 5 is a detailed flowchart of the wafer process in Step 104. Step 111 (oxidation) oxidizes the wafer's surface. Step 112 (CVD) forms an insulating film on the wafer's surface. Step 113 (electrode formation) forms electrodes on the wafer by vapor deposition, and the like. Step 114 (ion implantation) implants ions into the wafer. Step 115 (resist process) applies a photosensitive material onto the wafer. Step 116 (exposure) uses the exposure apparatus S to expose a circuit pattern on the mask onto the wafer. Step 117 (development) develops the exposed wafer. Step 118 (etching) etches parts other than a developed resist image. Step 119 (resist stripping) removes the unused resist after etching. These steps are repeated, and multilayer circuit patterns are formed on the wafer. The device fabrication method of this embodiment may manufacture higher quality devices than the conventional one.

In this first embodiment, a reduction of the supply flow rate of the nitrogen (or exhaust flow rate) and a reduction of a supply speed of the nitrogen may be replaced with a reduction of supply power of the nitrogen. Of course, the supply power has a different meaning from the supply flow rate and supply speed, but similar effects are obtained in this embodiment even when the supply flow rate and the supply speed are replaced with the supply power.

The supply power and the exhaust power mean those powers to be supplied and to be exhausted, respectively. More specifically, they depend upon the pressure at the supply (or exhaust) side and gas's flowability in a pipe between the supplying (or exhausting) side and the supplied (or exhausted) side, such as a pipe's sectional area and length. For example, when the pressure of the supplying side is maintained to be high, the supply speed (or supply amount) depends upon a pressure difference between the supplying side and the supplied side and the supply speed is maintained to be constant, if the pressure of the supplied side is constant. However, if the pressure of the supplied side (or chamber in this case) changes, a pressure difference between the supplying side and the supplied side can change and the supply speed (or supply amount) can change. In this case, the supply speed (or supply amount) changes irrespective of the constant supply power. In other words, the supply power is the power to be supplied, and is different from the resultant supply speed and supply amount. Of course, this is true of the exhaust power.

Second Embodiment

Figure 6:
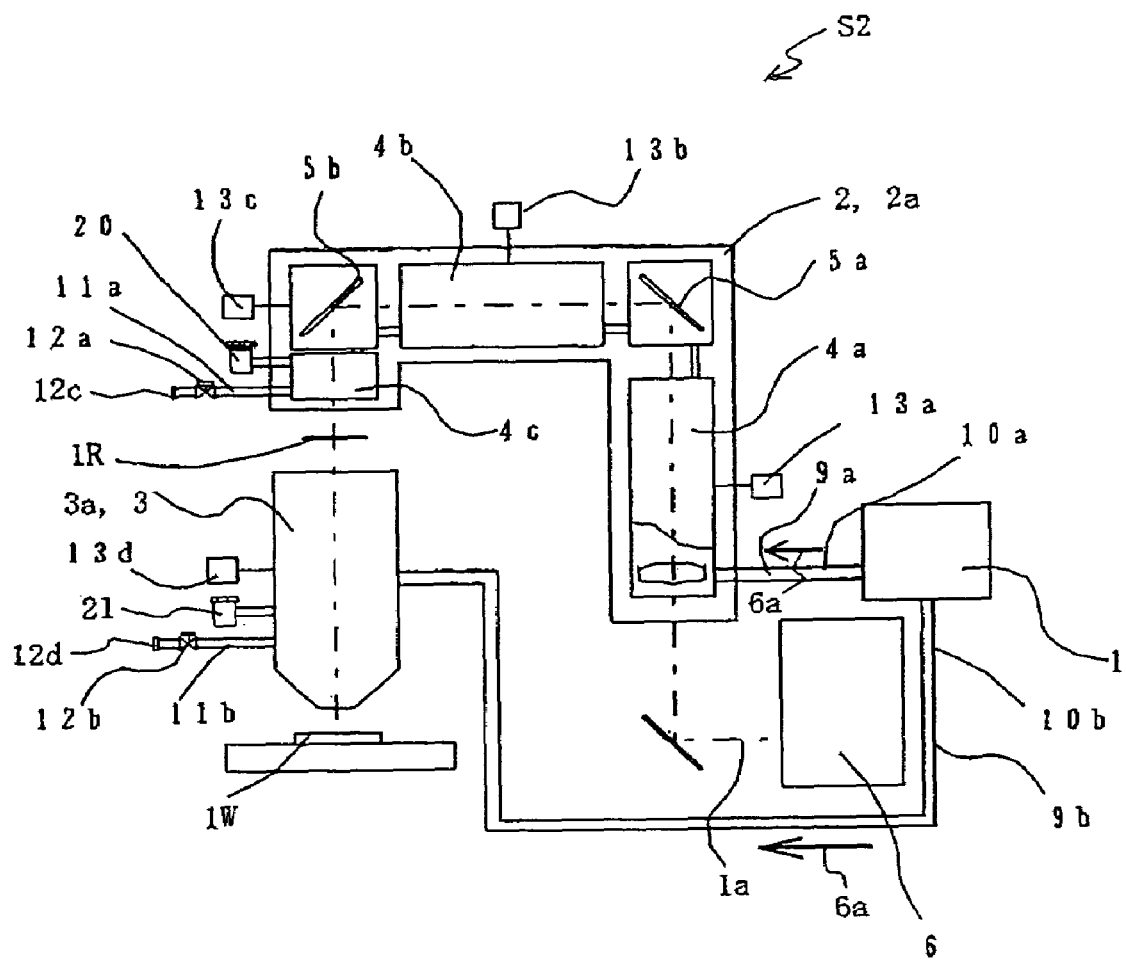
FIG. 6 is a block diagram showing a schematic internal structure of an exposure apparatus according to a second embodiment of the present invention.
Figure 7:
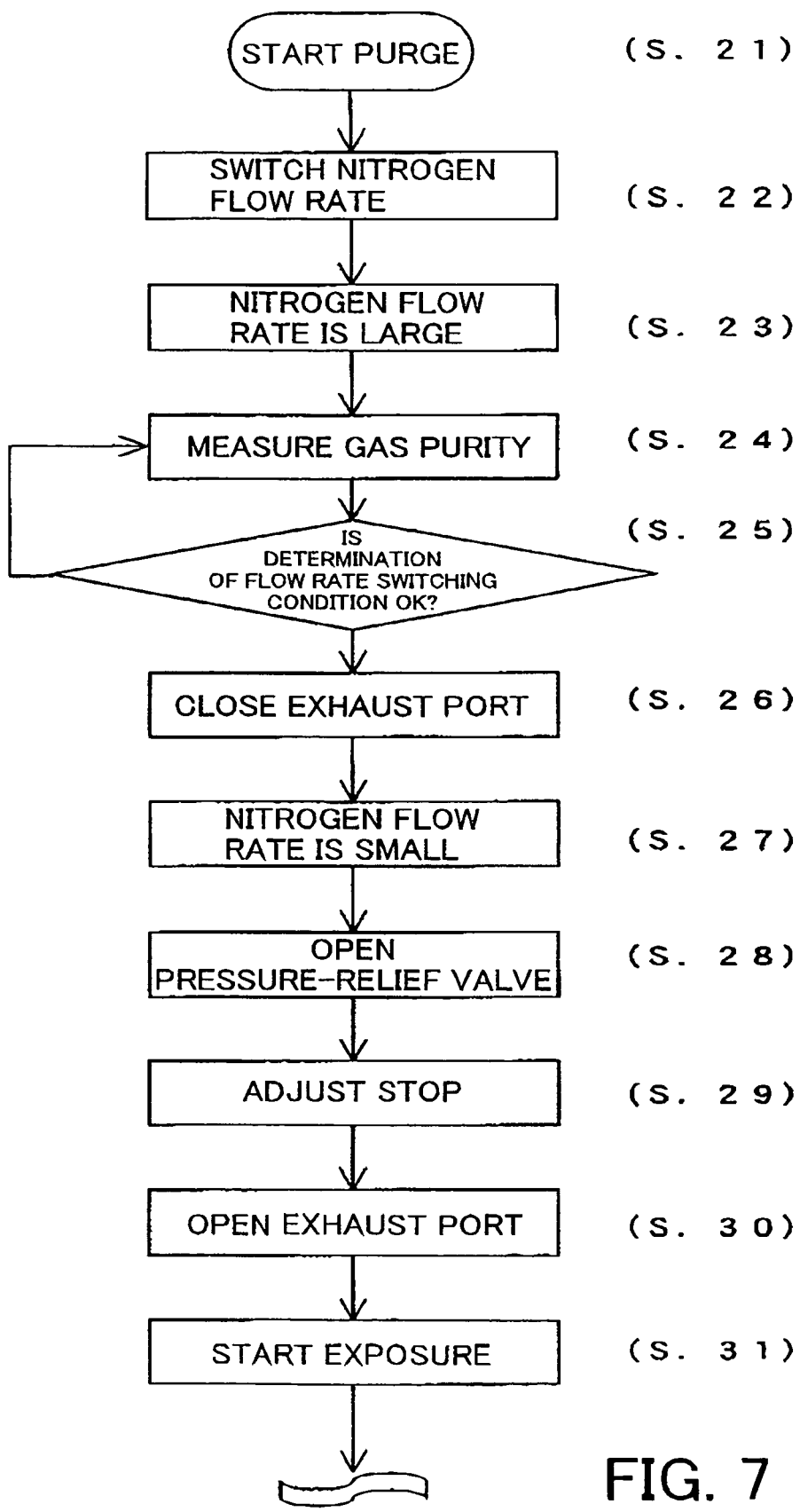
FIG. 7 is a flowchart showing an inert-gas purge procedure of the exposure apparatus shown in FIG. 6.

Referring now to FIGS. 6 and 7, a description will be given of an exposure apparatus and its inert-gas purge method of a second embodiment of the present invention. In these figures, those elements which are the same as corresponding elements in the first embodiment are designated by the same reference numerals, and a description thereof will be omitted.

The second embodiment uses pressure-relief valves 20 and 21 instead of a pressure gauge. The pressure-relief valves 20 and 21 are provided to the chambers 2a and 3a, and automatically open when the internal pressure in the chamber becomes the preset pressure or greater, so as to exhaust the atmosphere in the chambers 2a and 3a to the outside. When the internal pressure of the chamber is less than the set pressure (for example, half of the set pressure), the pressure-relief valves 20 and 21 close again and stop exhausting.

Referring to a flowchart shown in FIG. 7, a description will be given of the nitrogen gas purge method in the exposure apparatus S2 of the second embodiment. Even in this flowchart, a description will be omitted for those steps which are the same as corresponding steps in the nitrogen gas purge method of the first embodiment.

Steps (S. 21) to (S. 24) are similar to the above steps (S. 11) to (S. 14). When the oxygen concentration is equal to or below the predetermined concentration (step S. 25), a valve controller closes the valves 12a and 12b of the exhaust ports 12c and 12d (step S. 26). Thereby, the exhausts from the exhaust ports 12c and 12d stop and the internal pressures in the chambers 2a and 3a rise. Accordingly, the mass flow controller 10a and 10b switch the flow rates and reduce the supply flow rate of the nitrogen gas 6a (supply flow rate reducing step S. 27).

When the internal pressures in the chambers 2a and 3a increase up to the set pressure or higher, the pressure-relief valves 20 and 21 automatically open and exhaust the atmospheres in the chambers at the second exhaust flow rate (second exhaust step S. 28). This set pressure is set to be, for example, higher than the ambient pressure. Thereby, the insides of the chambers 2a and 3a can always be maintained at a positive stage irrespective of a reduced supply flow rate of the nitrogen gas 6a. This configuration can prevent the backflows and entries of the external air into the chambers 2a and 3a via joint parts between the components of the chambers 2a and 3a and via the exhaust ports 12c and 12d. Thus, in the second embodiment, the first exhausting step uses the exhaust ports (i.e., the exhaust port 12c for the chamber 2a and the exhaust port 12d for the chamber 3a), and the second exhausting step uses the pressure-relief valves (i.e., the pressure-relief valve 20 for the chamber 2a and the pressure-relief valve 21 for the chamber 3a).

When the pressure-relief valves 20 and 21 open, the valve controller adjusts and tightens the valves 12a and 12b (step S. 29), the exhaust ports 12c and 12d open and start exhausting (step S. 30). The insides of the chambers 2a and 3a are maintained at the positive pressure state. Therefore, the exposure starts without the downtime, because there is no temporary oxygen concentration due to the backflow of the external air (step S. 31).

Third Embodiment

Figure 8:
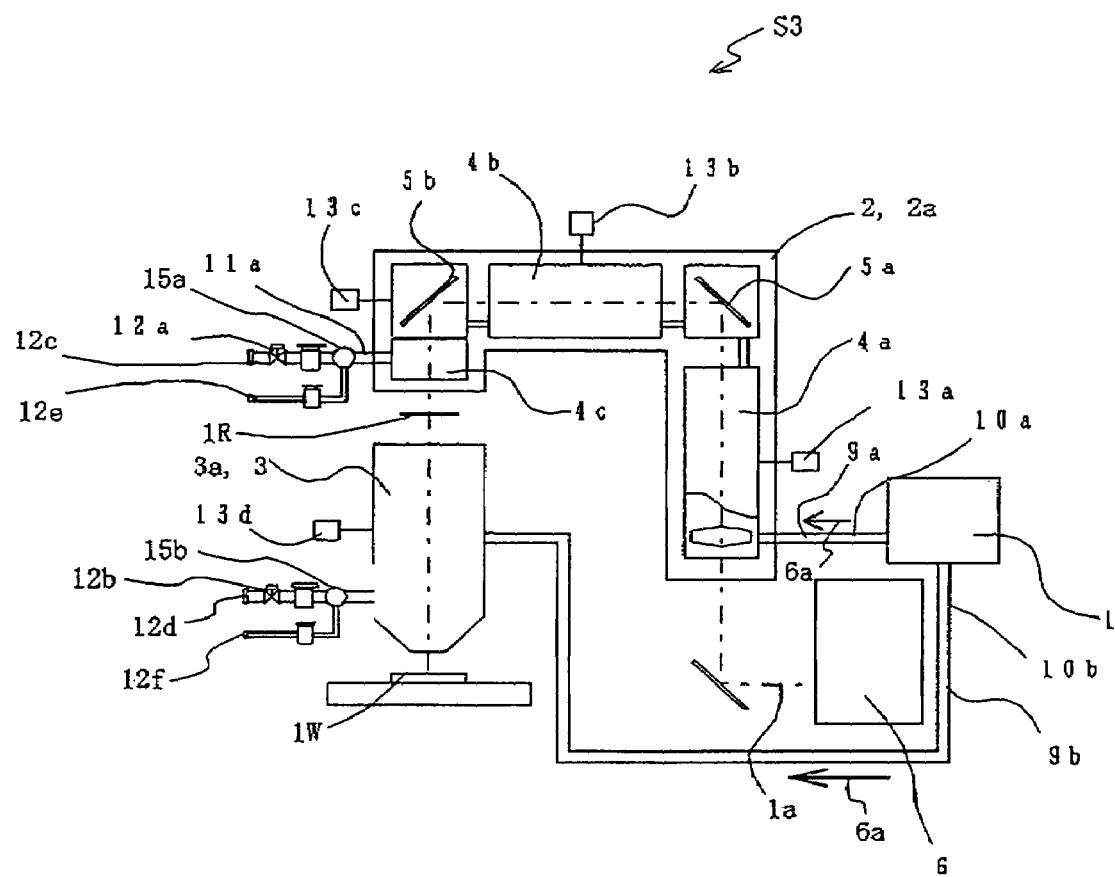
FIG. 8 is a block diagram showing a schematic internal structure of an exposure apparatus according to a third embodiment of the present invention.
Figure 9:
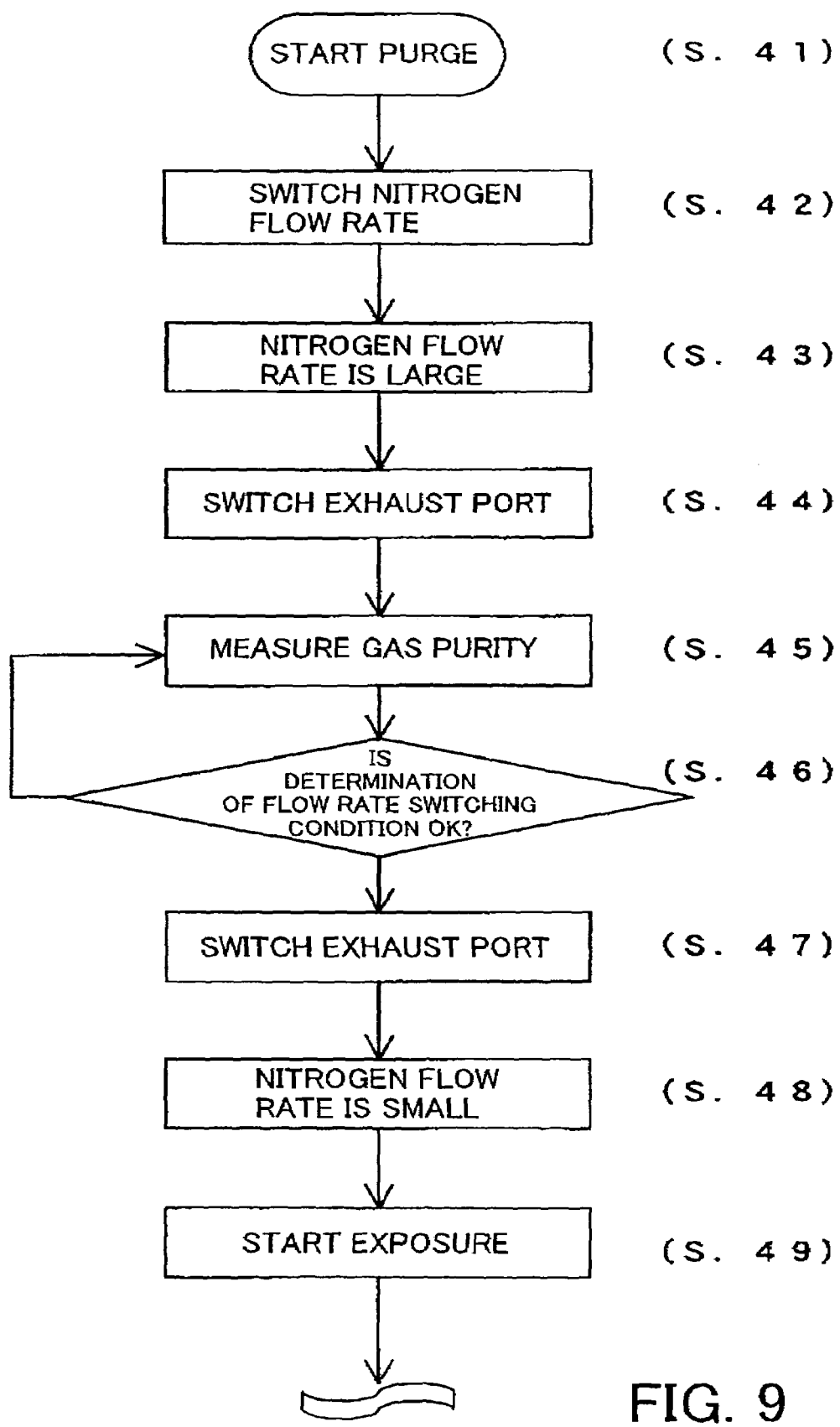
FIG. 9 is a flowchart showing an inert-gas purge procedure of the exposure apparatus shown in FIG. 8.

Referring now to FIGS. 8 and 9, a description will be given of an exposure apparatus and its inert-gas purge method of a second embodiment of the present invention. In these figures, those elements which are the same as corresponding elements in the first embodiment are designated by the same reference numerals, and a description thereof will be omitted.

In the third embodiment, each of the chambers 2a and 3a has two types of exhaust ports, i.e., narrow exhaust ports 12e and 12f for realizing a second exhaust step, in addition to the exhaust ports 12c and 12d for realizing a first exhaust step, similar to the first embodiment.

The narrow exhaust ports 12e and 12f are narrower than the exhaust ports 12c and 12d, and have a larger exhaust resistance. Therefore, the narrow exhaust ports 12e and 12f have more difficulties to exhaust the atmospheres in the chambers than the exhaust ports 12c and 12d, and have reduced exhaust flow rates. In the chamber 2a that houses the illumination optical system 2, the gas exhaust line 11a branches into the exhaust port 12c and the narrow exhaust port 12e. A three-way valve 15a is provided at the branch node to switch the exhaust channel to the exhaust port 12c and the narrow exhaust port 12e. The chamber 3a that houses the projection optical system 3 has a similar structure, and provides a three-way valve 15b at the branch node between the exhaust port 12d and the narrow exhaust port 12f. A valve controller as part of an exhaust mass flow controller, for example, controls switching at the three-way valves 15a and 15b.

Referring to a flowchart shown in FIG. 9, a description will be given of the nitrogen gas purge method in the exposure apparatus S3 of the third embodiment. Even in this flowchart, a description will be omitted for those steps which are the same as corresponding steps in the nitrogen gas purge method of the first embodiment.

Steps (S. 41) to (S. 43) are similar to the above steps (S. 11) to (S. 13). In order to supply a large amount of nitrogen gas 6a to the chambers 2a and 3a, the valve controller switches the three-way valves 15a and 15b, and the exhaust ports 12c and 12d exhaust the atmospheres in the chambers 2a and 3a at the first flow rate (first exhaust step S. 44). Thereby, the atmospheres in the chambers 2a and 3a are quickly replaced, and impurities, such as oxygen, in the atmospheres are exhausted from the exhaust ports 12c and 12d. Simultaneously, removal of the deposits on the lens units 4a to 4c depletes the gas source of the outgas promptly. Since a large amount of nitrogen gas 6a is supplied to the chambers 2a and 3a, the internal pressure in the chambers 2a and 3a rise and are higher than the ambient pressure (or the external pressure outside the chambers).

When the purge starts, the oxygen concentration detectors 13a to 13d detect the oxygen concentrations in the chambers 2a and 3a (concentration detection step S. 45). Thereby, it is possible to determine the progress of the replacement with the inert gas in the chambers 2a and 3a and the degree of depletion of the outgas source. When the oxygen concentrations in the chambers 2a and 3a are larger than the preset concentrations, the replacement with the inert gas is not sufficient and a supply of a large amount of nitrogen gas 6a continues at the first exhaust flow rate. However, the oxygen concentrations in the chambers 2a and 3a are smaller than the preset concentrations (step S. 46), the valve controller switches the three-way valves 15a and 15b from the exhaust ports 12c and 12d to the narrow exhaust ports 12e and 12f, and the atmospheres in the chambers 2a and 3a are exhausted at the second exhaust flow rate (second exhaust step S. 47). This configuration reduces the exhaust flow rates from the chambers 2a and 3a, and increases the pressures inside the chambers 2a and 3a. Simultaneously, the mass flow controllers 10a and 10b switch the flow rates (step S. 16), and the supply flow rate of the nitrogen gas 6a reduces (a reducing step of supply flow rate step S. 48).

Since the exhaust channel is switched to the narrow exhaust ports 12e and 12f, the insides of the chambers 2a and 3a can always be maintained at a positive state irrespective of a reduced supply flow rate of the nitrogen gas 6a. This configuration can prevent the backflows and entries of the external air into the chambers 2a and 3a via joint parts between the components of the chambers 2a and 3a and via the exhaust ports 12c and 12d. Therefore, the exposure starts without the downtime, because there is no temporary oxygen concentration due to the backflow of the external air (step S. 49).

Variation

Figure 10:
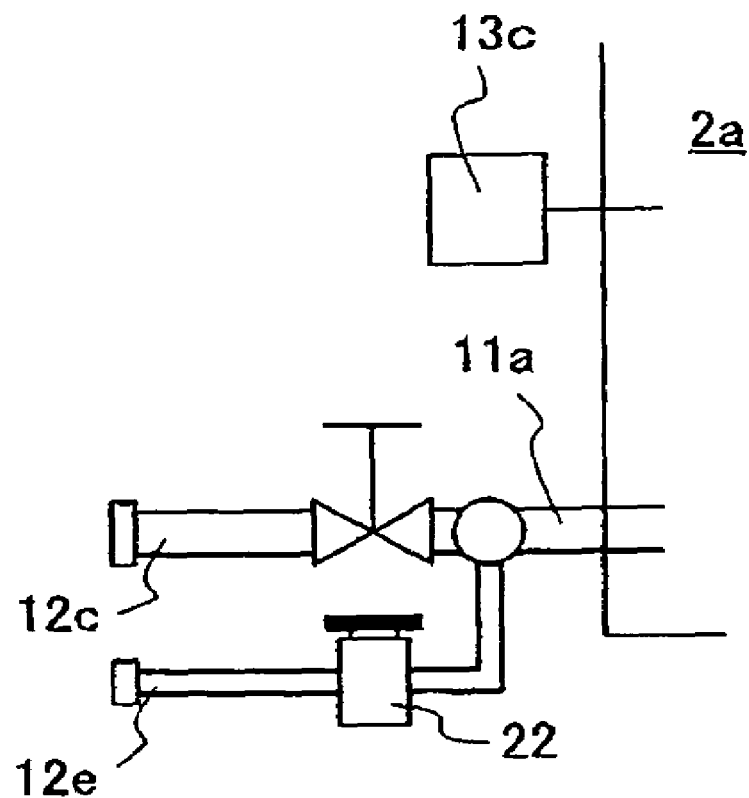
FIG. 10 is a partial enlarged view of an exhaust port in a chamber that houses an illumination optical system in an exposure apparatus as a variation of the present invention.
Figure 11:
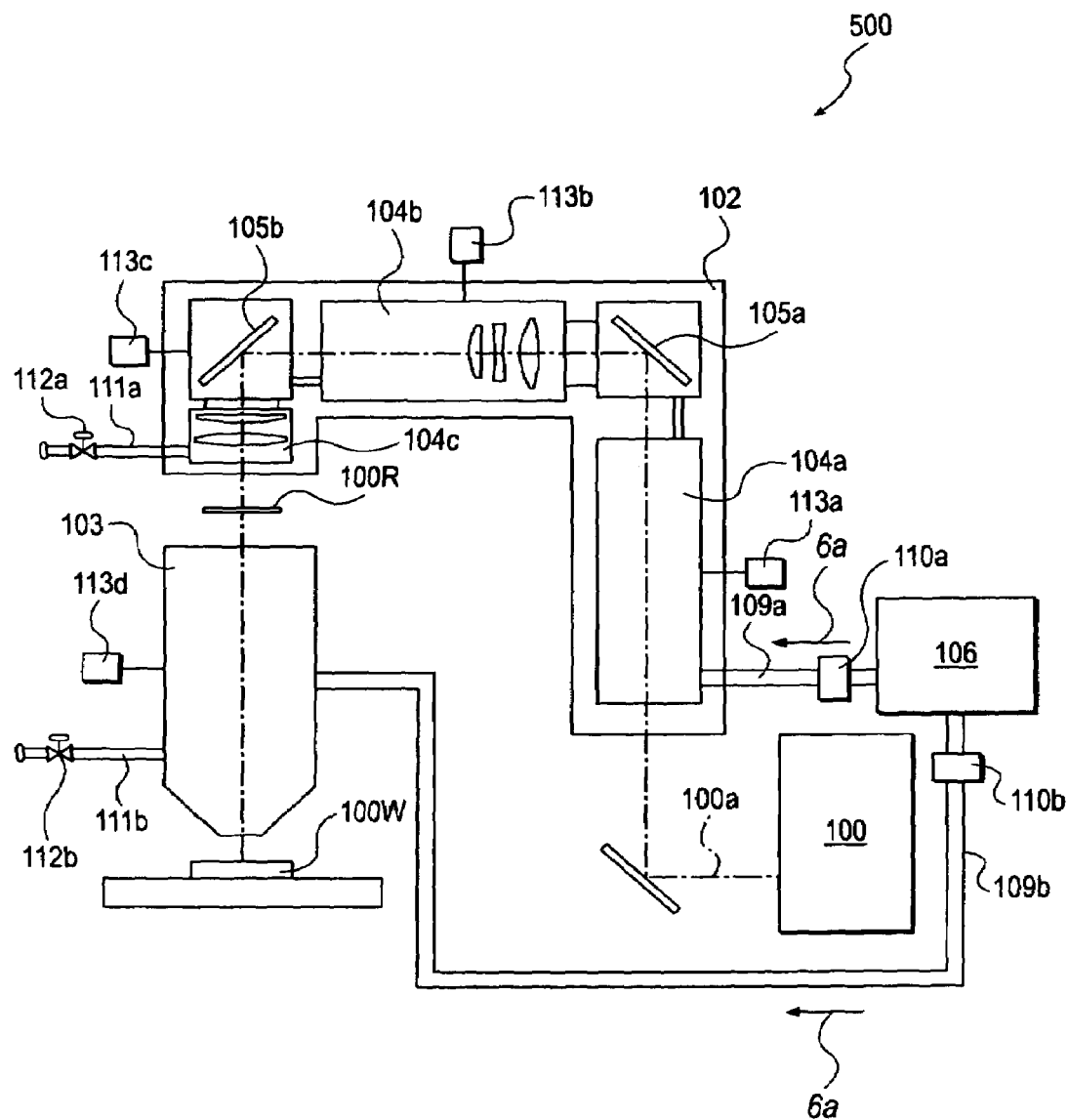
FIG. 11 is a block diagram showing a schematic internal structure of a conventional exposure apparatus.

When the pressures in the chambers 2a and 3a excessively increase after the channel is switched to the narrow exhaust ports 12e and 12f, a pressure-relief valve 22 may be provided, for example, on the exhaust line of the narrow exhaust port 12e, as shown in FIG. 10, which is a partial enlarged view of the exhaust port of the chamber 2. Thereby, when the inner pressure in the chamber 2a is higher than the constant pressure, the pressure-relief valve 22 automatically opens and prevents the excessive rise of the inner pressure of the chamber, as well as providing more precise pressure control for the chambers 2a and 3a.

Thus, the present invention can inexpensively reduce the impurity concentration in the atmosphere around the optical system in an exposure apparatus, and shorten the downtime. In addition, the present invention can improve the exposure performance and efficiency of the exposure apparatus with high precision and high throughput.

Further, the present invention is not limited to these preferred embodiments, ous variations and modifications may be made without departing from the scope of ent invention.

Foreign Priority

This application claims foreign priority based on Japanese Patent Application 403918, filed Dec. 3, 2003, which is hereby incorporated by reference herein.

What is claimed is:

1. An exposure apparatus for exposing a substrate to light from a light source via a reticle, said apparatus comprising:
   an optical system configured to introduce the light via the reticle to the substrate;
   a chamber configured to house at least a part of said optical system;
   a supply system configured to supply inert gas into said chamber at a variable supply flow rate;
   an exhaust system configured to exhaust gas from said chamber at a variable exhaust flow rate; and
   a controller configured to control said supply system so as to reduce the supply flow rate, and configured to control said exhaust system so as to reduce the exhaust flow rate prior to the reduction of the supply flow rate.

2. An apparatus according to claim 1, further comprising a concentration detector configured to detect a concentration of a target material in said chamber,
   wherein said controller is configured to control said supply system so as to reduce the supply flow rate based on the detected concentration.

3. An apparatus according to claim 2, wherein the target material is at least one of oxygen and water.

4. An apparatus according to claim 1, further comprising a pressure detector configured to detect a pressure in said chamber,
   wherein said controller is configured to control said exhaust system so as to change the exhaust flow rate based on the detected pressure.

5. An apparatus according to claim 1, wherein said exhaust system comprises:
   a first valve configured to change an exhaust resistance to gas exhausted from said chamber; and
   a second valve configured to open if a pressure in said chamber becomes no less than a set pressure.

6. An apparatus according to claim 1, wherein said exhaust system comprises:
   two channels having exhaust resistances different from each other;
   a first valve configured to switch said channels; and
   a second valve provided in one of said two channels having a larger exhaust resistance and configured to open if a pressure in the one of said two channels becomes no less than a set pressure.

7. A device manufacturing method comprising steps of:
   exposing a substrate to light via a reticle using an exposure apparatus as defined in claim 1;
   developing the exposed substrate; and
   processing the developed substrate to manufacture the device.

8. A purge method applied to an exposure apparatus for exposing a substrate to light via a reticle and an optical system, at least a part of the optical system being housed in a chamber, said method purging a material in the chamber with inert gas, said method comprising:
   a supply step of supplying the inert gas into the chamber using a supply system;
   an exhaust step of exhausting gas from the chamber using an exhaust system;
   a supply control step of reducing a supply flow rate of the inert gas supplied from the supply system; and
   an exhaust control step of reducing an exhaust flow rate of gas exhausted from the chamber prior to the reduction of the supply flow rate.

9. A method according to claim 8, further comprising a concentration detecting step of detecting a concentration of a target material in the chamber,
   wherein said supply control step reduces the supply flow rate based on the detected concentration.

10. A method according to claim 9, wherein the target material is at least one of oxygen and water.

11. A method according to claim 8, further comprising a pressure detecting step of detecting a pressure in the chamber,
    wherein said exhaust control step changes the exhaust flow rate based on the detected pressure.

12. A method according to claim 8, wherein the exhaust system includes:
    a first valve configured to change an exhaust resistance to gas exhausted from the chamber; and
    a second valve configured to open if a pressure in the chamber becomes no less than a set pressure.

13. A method according to claim 8, wherein the exhaust system includes:
    two channels having exhaust resistances different from each other,
    a first valve configured to switch the channels; and
    a second valve provided in one of the two channels having a larger exhaust resistance and configured to open if a pressure in the one of the two channels becomes no less than a set pressure.

* * * * *

UNITED STATES PATENT AND TRADEMARK OFFICE
CERTIFICATE OF CORRECTION

Figure 12:
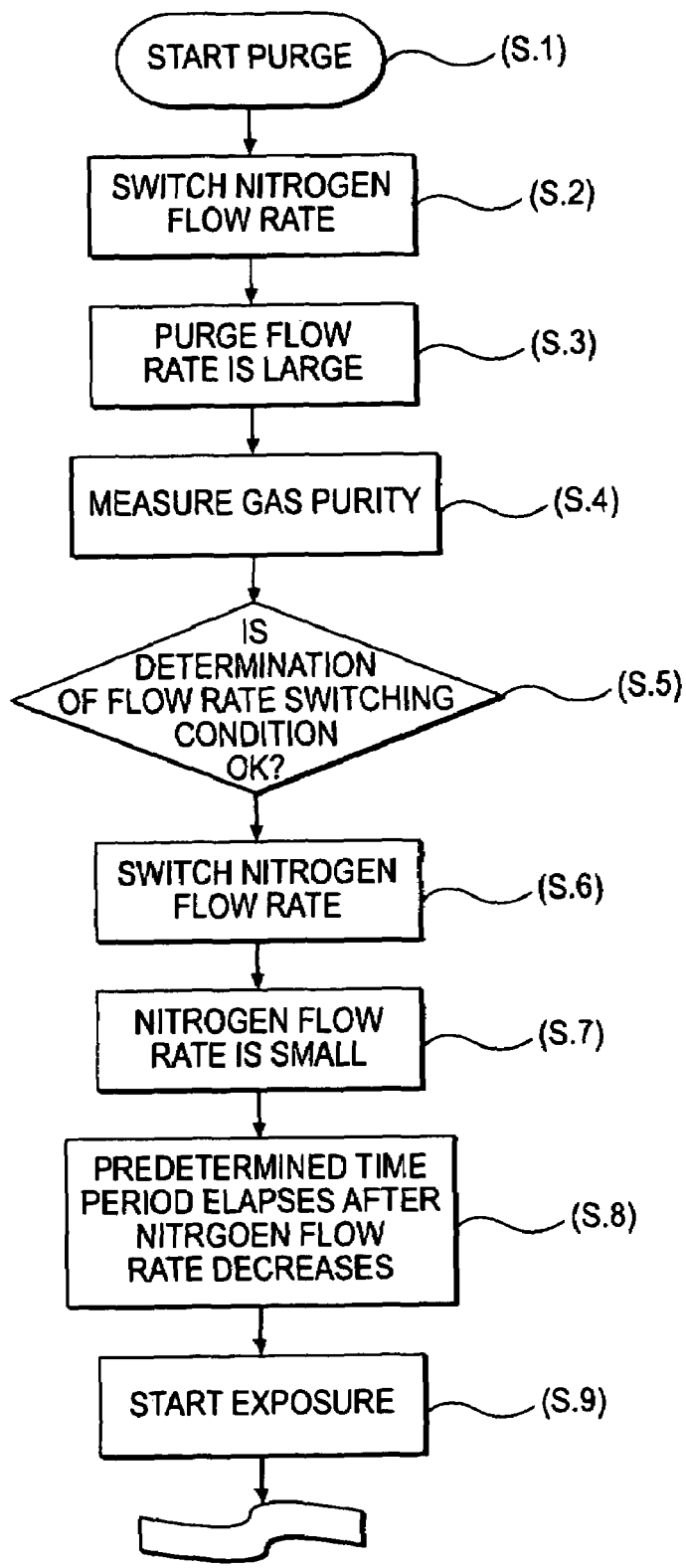
FIG. 12 is a flowchart showing an inert-gas purge procedure of the exposure apparatus shown in FIG. 11.

PATENT NO.        : 7,130,015 B2
APPLICATION NO.   : 11/001115
DATED             : October 31, 2006
INVENTOR(S)       : Yasuteru Tominaga It is certified that error appears in the above-identified patent and that said Letters Patent is hereby corrected as shown below:

IN THE DRAWINGS:
   "Sheet 5 of 12," "FIG. 5," in the box labeled "(STEP111)," "OXIDIATION" should read -- OXIDATION --.
   "Sheet 12 of 12," "FIG. 12," in the box labeled "(S.8)," in the thrid row, "NITRGOEN" should read -- NITROGEN --.

COLUMN 1:
   Line 31, the second occurrence of "in" should be deleted.

COLUMN 2:
   Line 61, "reduces." should read -- decreases. --

COLUMN 4:
   Line 54, "chamber" should read -- chambers --.

COLUMN 5:
   Line 15, "reduces" should read -- decreases --.

COLUMN 6:
   Line 5, "reduces" should read -- decreases --.
   Line 12, "reduces." should read -- decreases. --.
   Line 30, "reduces," should read -- decreases, --.
   Line 48, "reduces." should read -- decreases. --.
   Line 65, "reduces" should read -- decreases --.
   Line 67, "reduces" should read -- decreases --.

COLUMN 7:
   Line 15, "reduces" should read -- decreases --.
   Line 17, "reduces" should read -- decreases --.

COLUMN 10:
   Line 28, "reduces" should read -- decreases --.
   Line 60, "ous" should read -- various --.
   Line 66, "Application 403918," should read -- Application No. 2003-403918, --.

UNITED STATES PATENT AND TRADEMARK OFFICE
CERTIFICATE OF CORRECTION

PATENT NO. : 7,130,015 B2
APPLICATION NO. : 11/001115
DATED : October 31, 2006
INVENTOR(S) : Yasuteru Tominaga It is certified that error appears in the above-identified patent and that said Letters Patent is hereby corrected as shown below:

COLUMN 12:
   Line 39, "other," should read -- other; --.

Signed and Sealed this

Fourteenth Day of August, 2007

JON W. DUDAS
*Director of the United States Patent and Trademark Office*